US012566208B2

(12) United States Patent
Glazer

(10) Patent No.: US 12,566,208 B2
(45) Date of Patent: Mar. 3, 2026

(54) PULSED LASER MICRO LED INSPECTION

(71) Applicant: Orbotech Ltd., Yavne (IL)

(72) Inventor: Arie Glazer, Mevaseret (IL)

(73) Assignee: Orbotech Ltd., Yavne (IL)

( * ) Notice: Subject to any disclaimer, the term of this patent is extended or adjusted under 35 U.S.C. 154(b) by 231 days.

(21) Appl. No.: 18/472,508

(22) Filed: Sep. 22, 2023

(65) Prior Publication Data

US 2025/0102558 A1 Mar. 27, 2025

(51) Int. Cl.
*G01R 31/26* (2020.01)
*G01R 31/27* (2006.01)

(52) U.S. Cl.
CPC ....... *G01R 31/2635* (2013.01); *G01R 31/275* (2013.01)

(58) Field of Classification Search
CPC .... G01R 31/26; G01R 31/2635; G01R 31/27; G01R 31/275; G01R 23/00; G01R 23/18; G01R 31/265; H01J 27/24; H01J 3/024
See application file for complete search history.

(56) References Cited

U.S. PATENT DOCUMENTS

| | | |
|---|---|---|
| 7,466,161 B2 | 12/2008 | Gardner et al. |
| 8,941,824 B2 | 1/2015 | Nakanishi et al. |
| 9,523,714 B2 | 12/2016 | Kadyshevitch et al. |
| 11,456,288 B2 | 9/2022 | Onuma et al. |
| 2006/0279297 A1 | 12/2006 | Nystrom et al. |
| 2016/0161294 A1* | 6/2016 | Ip ............................ G01J 3/465 |
| | | 250/578.1 |
| 2022/0163634 A1 | 5/2022 | Gorman et al. |
| 2022/0276090 A1* | 9/2022 | Hasegawa ................. G01J 1/44 |

FOREIGN PATENT DOCUMENTS

| | | |
|---|---|---|
| CN | 110165026 B | 11/2020 |
| CN | 113508454 B | 2/2023 |
| JP | 6964725 B2 | 11/2021 |
| JP | 2022161036 A | 10/2022 |
| KR | 102318507 B1 | 10/2021 |
| KR | 102428402 B1 | 8/2022 |
| KR | 20220148427 A | 11/2022 |
| KR | 102485363 B1 | 1/2023 |
| TW | 202242441 A | 11/2022 |

* cited by examiner

*Primary Examiner* — Son T Le

(74) *Attorney, Agent, or Firm* — Hodgson Russ LLP

(57) ABSTRACT

The system includes a laser generator, an antenna, and a processor to distinguish the photovoltaic radio frequency signals emitted by defective LEDs and functioning LEDs in a contactless manner. The laser generator emits a pulsed laser beam toward an LED. The LED generates a photovoltaic radio frequency signal when radiated by the pulsed laser beam. The antenna receives the photovoltaic radio frequency signal generated by the LED. The processor is in electronic communication with the antenna and is configured to read the photovoltaic radio frequency signal and determine whether the LED is a defective LED or a functioning LED based on the photovoltaic radio frequency signal, such as by using the frequency, amplitude, or phase shift of the radio frequency signal.

20 Claims, 7 Drawing Sheets

115
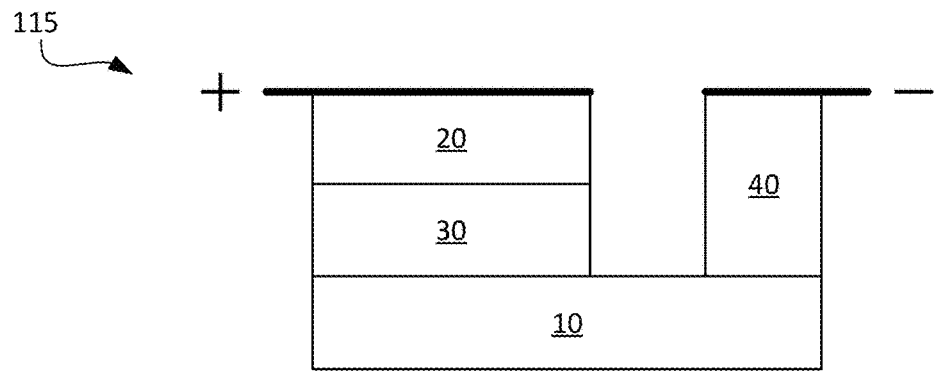
FIG. 2A
115
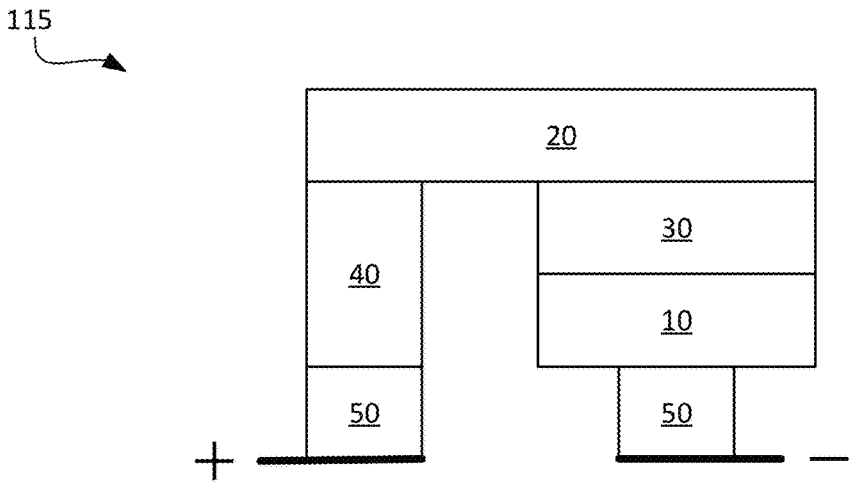
FIG. 2B
115
FIG. 2C

130

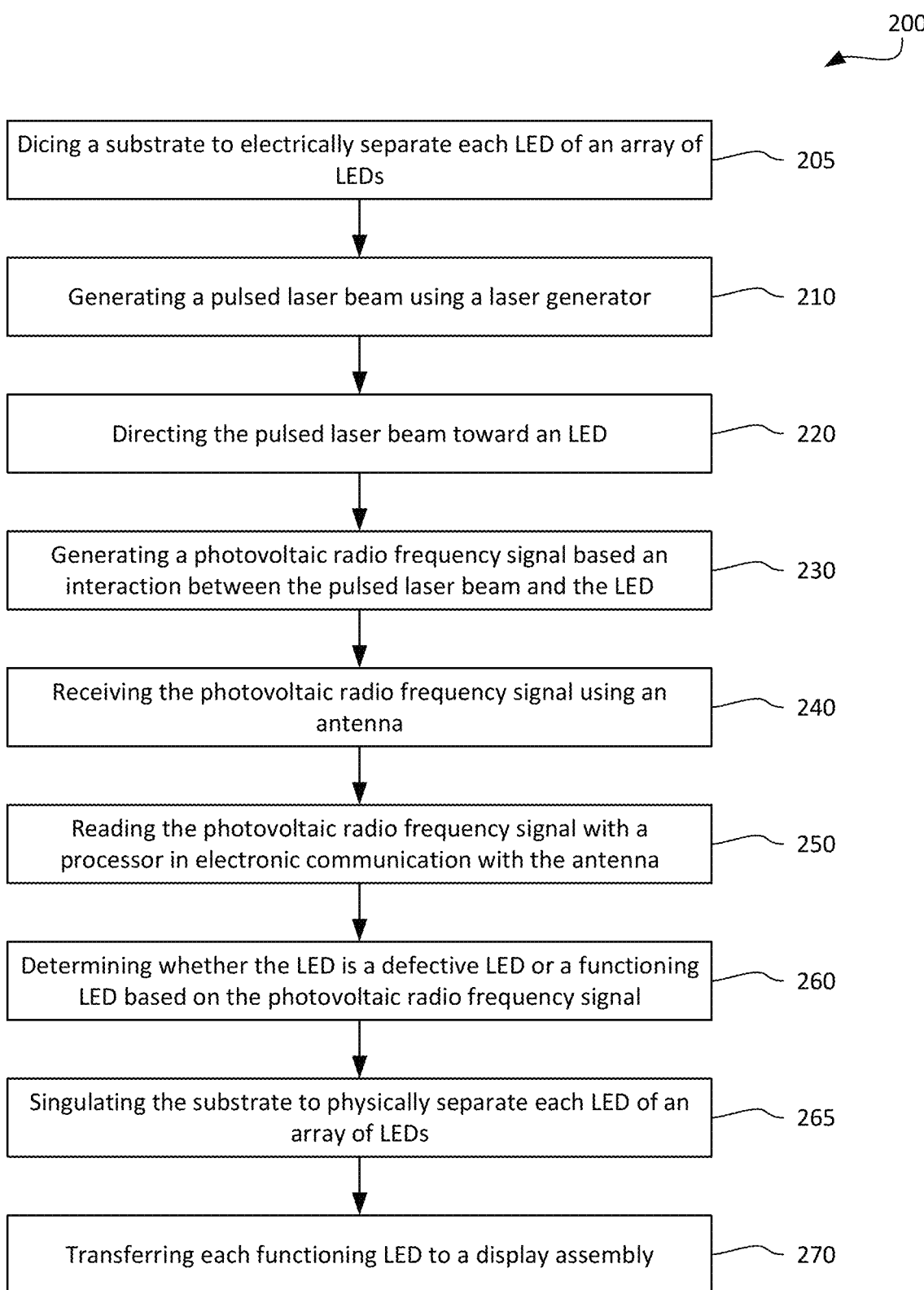

200

Dicing a substrate to electrically separate each LED of an array of LEDs — 205

Generating a pulsed laser beam using a laser generator — 210

Directing the pulsed laser beam toward an LED — 220

Generating a photovoltaic radio frequency signal based an interaction between the pulsed laser beam and the LED — 230

Receiving the photovoltaic radio frequency signal using an antenna — 240

Reading the photovoltaic radio frequency signal with a processor in electronic communication with the antenna — 250

Determining whether the LED is a defective LED or a functioning LED based on the photovoltaic radio frequency signal — 260

Singulating the substrate to physically separate each LED of an array of LEDs — 265

Transferring each functioning LED to a display assembly — 270

FIG. 6

PULSED LASER MICRO LED INSPECTION

FIELD OF THE DISCLOSURE

This disclosure relates to micro LED manufacturing and, more particularly, to inspection processes for micro LEDs and manufacturing micro LED displays.

BACKGROUND OF THE DISCLOSURE

In the manufacturing of micro LEDs, thousands of LEDs (less than 100 μm in size) are fabricated on a single semiconductor wafer. Each micro LED must be separated from the wafer (and the other LEDs) to be assembled into a micro LED display panel. In this process, inspection and testing is used to ensure that each LED is functional before it is placed in the display panel assembly to avoid defective LEDs in the display panel. Given the massive amount of micro LEDs on a small wafer, testing each LED can be a very difficult and time consuming process.

Typical LED testing includes photoluminescence (PL) and electroluminescence (EL) tests. PL tests can test LED chips without contact, but have a lower detection efficiency compared to EL test. EL tests are able to identify more defects, but they test LED chips by setting up electric currents which requires contacting the LED chips that might lead to chip damages. For micro LED inspection, applying EL tests can be very difficult and slow as the chip size is too small for conventional testing equipment, and using PL tests might miss some defects, resulting in lower efficiency.

Therefore, what is needed is a method of micro LED inspection that is contactless and has high detection efficiency.

BRIEF SUMMARY OF THE DISCLOSURE

An embodiment of the present disclosure provides a system. The system may comprise a laser generator configured to emit a pulsed laser beam toward an LED. The LED may generate a photovoltaic radio frequency signal when radiated by the pulsed laser beam. The system may further comprise an antenna configured to receive the photovoltaic radio frequency signal generated by the LED. The system may further comprise a processor in electronic communication with the antenna that is configured to read the photovoltaic radio frequency signal and determine whether the LED is a defective LED or a functioning LED based on the photovoltaic radio frequency signal.

In some embodiments, the pulsed laser beam may have a frequency of 5 to 10 MHz.

In some embodiments, the LED may comprise an array of LEDs disposed on a substrate.

In some embodiments, the laser generator may be configured to radiate a single LED of the array of LEDs.

In some embodiments, the system may further comprise a stage configured to move in a plane perpendicular to the pulsed laser beam. The substrate may be disposed on the stage. The laser generator may be further configured to scan the pulsed laser beam across the array of LEDs by moving the stage relative to the laser generator, such that each LED generates a photovoltaic radio frequency signal when radiated by the pulsed laser beam.

In some embodiments, the LED may have a lateral chip structure.

In some embodiments, the antenna may be annular and may define an aperture. The laser generator may be configured to emit the pulsed laser beam toward the LED through the aperture of the antenna.

In some embodiments, the processor may comprises a receiving circuit configured to receive the photovoltaic radio frequency signal from the antenna, an amplifying circuit configured to amplify the photovoltaic radio frequency signal received by the receiving circuit, and a determining circuit configured to determine whether the LED is a defective LED or a functioning LED based on the photovoltaic radio frequency signal amplified by the amplifying circuit.

In some embodiments the processor may be configured to determine whether the LED is a defective LED or a functioning LED by comparing the photovoltaic radio frequency signal to a model waveform. The LED may be determined to be a defective LED or a functioning LED based on a similarity of the photovoltaic radio frequency signal to the model waveform.

In some embodiments, the system may further comprise an oscilloscope. The oscilloscope may be in electronic communication with the processor and may be configured to display the photovoltaic radio frequency signal.

Another embodiment of the present disclosure provides a method. The method may comprise: generating a pulsed laser beam using a laser generator; directing the pulsed laser beam toward an LED; generating a photovoltaic radio frequency signal based on interaction between the pulsed laser beam and the LED; receiving the photovoltaic radio frequency signal using an antenna; reading the photovoltaic radio frequency signal with a processor in electronic communication with the antenna; and determining, using the processor, whether the LED is a defective LED or a functioning LED based on the photovoltaic radio frequency signal.

In some embodiments, the LED may comprise an array of LEDs disposed on a substrate, and directing the pulsed laser beam toward the LED may comprise directing the pulsed laser beam toward the array of LEDs to radiate a single LED of the array of LEDs.

In some embodiments, the LED may comprise an array of LEDs disposed on a substrate, and directing the pulsed laser beam toward the LED may comprise scanning the pulsed laser beam across the array of LEDs, such that each LED generates a photovoltaic radio frequency signal when radiated by the pulsed laser beam.

In some embodiments, the substrate may be disposed on a stage that is movable in a plane perpendicular to the pulsed laser beam, and scanning the pulsed laser beam across the array of LEDs may comprise scanning the pulsed laser beam across the array of LEDs by moving the stage relative to the laser generator.

In some embodiments, before directing the pulsed laser beam toward the LED, the method may further comprise dicing the substrate to electrically separate each LED of the array of LEDs.

In some embodiments, the method may further comprise singulating the substrate to physically separate each LED of the array of LEDs; and transferring each functioning LED of the array of LEDs to a display assembly.

In some embodiments, the antenna may be annular and may define an aperture, and directing the pulsed laser beam toward the LED may comprise directing the pulsed laser beam toward the LED through the aperture of the antenna.

In some embodiments, determining, using the processor, whether the LED is a defective LED or a functioning LED may comprise comparing, using the processor, the photovoltaic radio frequency signal to a model waveform. The LED may be determined to be a defective LED or a functioning LED based on a similarity of the photovoltaic radio frequency signal and the model waveform.

DESCRIPTION OF THE DRAWINGS

For a fuller understanding of the nature and objects of the disclosure, reference should be made to the following detailed description taken in conjunction with the accompanying drawings, in which:

FIG. 2A is a schematic diagram of a lateral chip LED according to an embodiment of the present disclosure;

FIG. 2B is a schematic diagram of a flip-chip LED according to an embodiment of the present disclosure;

FIG. 2C is a schematic diagram of a vertical chip LED according to an embodiment of the present disclosure;

FIG. 6 is a flowchart of a method according to an embodiment of the present disclosure.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process, step, and electronic changes may be made without departing from the scope of the disclosure. Accordingly, the scope of the disclosure is defined only by reference to the appended claims.

Figure 1:
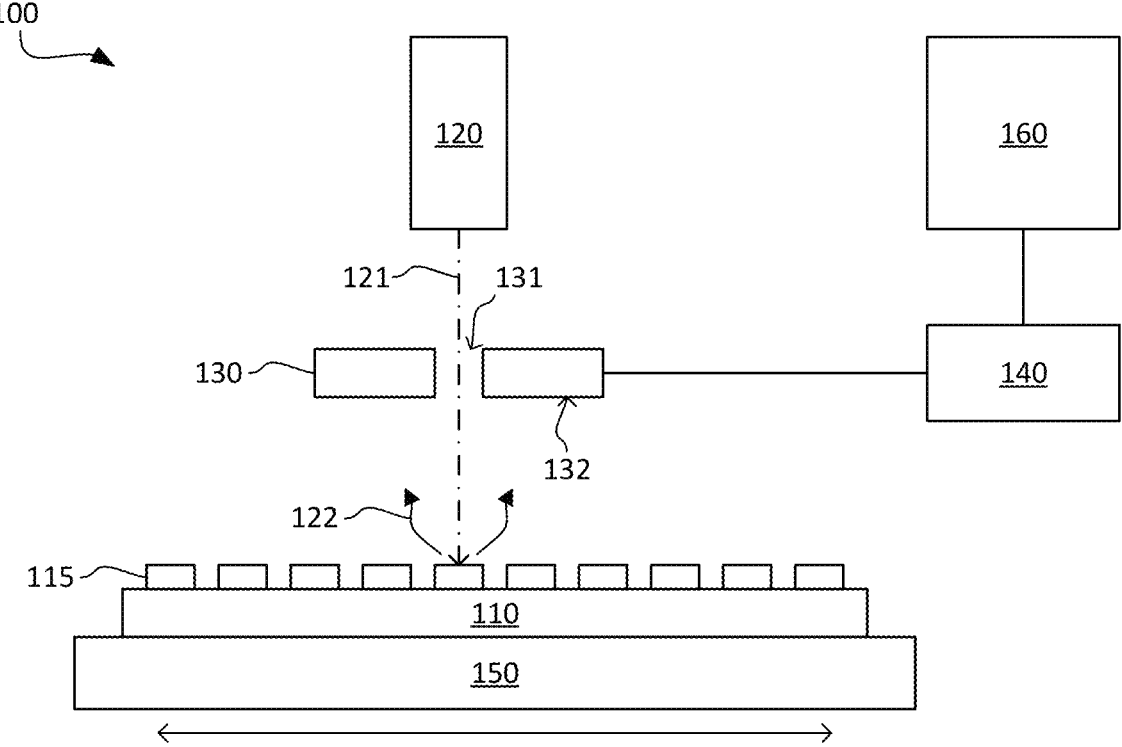
FIG. 1 is a cross-sectional side view of a system according to an embodiment of the present disclosure.

An embodiment of the present disclosure provides a system 100. The system 100 may be part of a semiconductor manufacturing system, for example, in the fabrication of micro LEDs for micro LED display panels. As shown in FIG. 1, the system 100 may comprise a substrate 110 (e.g., a semiconductor wafer) having at least one LED 115 disposed thereon. In some embodiments, there may be an array of LEDs 115 disposed on the substrate 110. The substrate 110 may be comprised of GaAs, GaN, or other semiconductor wafer materials. The substrate 110 may be rectangular, square, circular, or other shapes. In some instances, the substrate 110 may have a width/diameter of 2-8 inches (e.g., 2, 3, 4, 6, or 8 inches, and any size therebetween). During the fabrication process of the LEDs 115, each LED may be electrically connected together. A dicing process may be used to electrically separate (i.e., sever the electrical connections) the LEDs 115, and then a singulation process may be used to physically separate each LED 115 from each other and from the substrate 110 for placement in a display panel assembly. The singulation process may comprise elastomer stamping, electrostatic transfer, electromagnetic transfer, laser-assisted, transfer, fluid self-assembly, or any other mass transfer process used to transfer each LED 115 from the substrate 110 to a target substrate. Perforations 111

(shown in FIGS. 5A-5C) may represent the lines on which the dicing and singulation processes may be performed on the substrate 110. Additional perforations may be present to undercut portions of the LED 115 connected to the substrate 110, according to the structure of the LEDs 115 and the singulation process. The LEDs 115 may be micro LEDs (e.g., less than 100 μm in length and width and less than 8 μm in height) or other sizes. For example, each LED 115 may be 10 μm by 10 μm. Based on the size of the substrate 110 and the size of each LED 115, there may be over 1,000,000 LEDs 115 disposed on the substrate 110. Each LED 115 shown in FIG. 1 and FIGS. 5A-5C may represent a single LED or an array of LEDs. Accordingly, additional perforations 111 may be present to separate each LED of the array of LEDs within each illustrated LED 115.

The LEDs 115 may have various structure, such as lateral chip (shown in FIG. 2A), flip-chip (shown in FIG. 2B), vertical chip (shown in FIG. 2C), or other structures. In general, each LED 115 may comprise an N-doped layer 10, a P-doped layer 20, and a multiple quantum well layer 30 disposed between N-doped layer 10 and the P-doped layer 20. Connecting a negative electrode to the N-doped layer 10 and connecting a positive electrode to the P-doped layer 20 causes a forward bias between the N-doped layer 10 and the P-doped layer 20, via the multiple quantum well layer 30, which generates photons to emit light. In the lateral chip structure shown in FIG. 2A, a metal post 40 is disposed on the N-doped layer 10. The negative electrode is connected to the metal post 40, and the positive electrode is connected to the P-doped layer 20. In the flip-chip structure shown in FIG. 2B, a metal post 40 is disposed on the P-doped layer 20, and a bonding layer 50 is disposed on the N-doped layer 10 and the metal post 40. The negative electrode is connected to the bonding layer 50 on the N-doped layer 10, and the positive electrode is connected to the bonding layer 50 on the metal post 40. In the vertical chip structure shown in FIG. 2C, a bonding layer 50 is disposed on the N-doped layer 10. The negative electrode is connected to the bonding layer 50, and the positive electrode is connected to the P-doped layer 20.

The system 100 may further comprise a laser generator 120. The laser generator 120 may be configured to emit a pulsed laser beam 121 toward the LED 115. The pulsed laser beam 121 may be directed at the LED 115 perpendicular to the substrate 110, or at one or more oblique angles relative to the substrate 110. The laser generator 120 may be movable or rotatable to adjust the angle of incidence of the pulsed laser beam 121. The pulsed laser beam 121 may have a frequency of 5 to 10 MHz. The wavelength of the pulsed laser beam 121 may be less than or equal to the emission wavelength of the LED 115. For example, a pulsed laser beam 121 having a wavelength in the ultra-violet spectrum may be used to inspect red, green, and blue LEDs 115. Based on the size of the pulsed laser beam 121, the laser generator 120 may be configured to simultaneously radiate at least some of the array of LEDs 115 with the pulsed laser beam 121. In some embodiments, the pulsed laser beam 121 may be sized such that the laser generator 120 radiates a single LED 115. Accordingly, the pulsed laser beam 121 may have a diameter of corresponding to the size of a single LED 115. For example, the diameter of the pulsed laser beam 121 may be 100 μm or smaller, depending on the size of the LED 115. Upon interaction with the pulsed laser beam 121, the LED 115 may generate a photovoltaic radio frequency signal 122. For example, the pulsed laser beam 121 may cause a forward bias between the N-doped layer 10 and the P-doped layer 20 of the LED 115, which may emit near-field radio waves, forming the photovoltaic radio frequency signal 122. The photovoltaic radio frequency signal 122 generated by the LED 115 may vary, depending on whether the LED 115 is a defective LED or a functioning LED. For example, a defective LED may emit no radio frequency signal 122 or may emit a radio frequency signal 122 having a different frequency, amplitude, or phase shift compared to that of a functioning LED. The LED 115 may emit the photovoltaic radio frequency signal 122 in a direction away from the substrate 110. The LED 115 may have a slow decay and may continue to emit the photovoltaic radio frequency signal 122 after interaction with the pulsed laser beam 121. Additional laser pulses may increase the intensity and the duration of the photovoltaic radio frequency signal 122 emitted by the LED 115. Accordingly, few laser pulses may be used to activate the LED 115 under test, and the number of laser pulses may be optimized to improve throughput.

Figure 3:
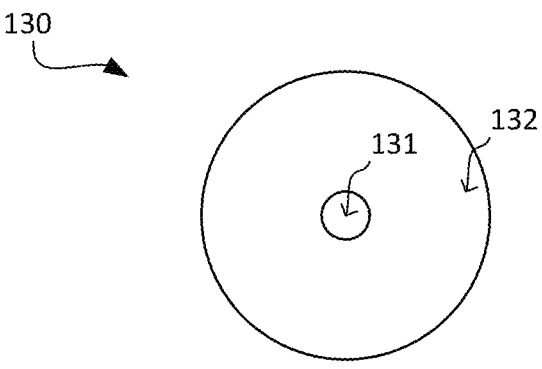
FIG. 3 is a bottom view of an antenna according to an embodiment of the present disclosure.

The system 100 may further comprise an antenna 130. The antenna 130 may be disposed between the laser generator 120 and the substrate 110. The antenna 130 may be configured to receive the photovoltaic radio frequency signal 122 generated by the LED 115. The sensitivity of the antenna 130 may be small enough to distinguish the photovoltaic radio frequency signals 122 emitted by defective LEDs and functioning LEDs. For example, the sensitivity of the antenna 130 may be configured such that the signals of defective LEDs and functioning LEDs are 5 standard deviations apart. In some embodiments, the antenna 130 may be annular. For example, as shown in FIG. 3, the antenna 130 may define an aperture 131, which may be circular or other shapes. The laser generator 120 may be configured to emit the pulsed laser beam 121 toward the LED 115 through the aperture 131 of the antenna 130. The diameter of the aperture 131 may be slightly larger than the diameter of the pulsed laser beam 121, to maximize the area of the bottom surface 132 of the antenna, which receives the photovoltaic radio frequency signal 122. The size of the antenna 130 may vary, depending on the size of the substrate 110, the distance between the antenna 130 and the substrate 110, and geometric constraints within the system 100. In some embodiments, the antenna 130 may be about ⅓ of the size of the substrate 110. When the antenna 130 is positioned closer to the substrate 110, the size of the antenna 130 may be smaller compared to the antenna 130 being positioned farther from the substrate 110.

The system 100 may further comprise a processor 140. The processor 140 may include a microprocessor, a microcontroller, or other devices.

The processor 140 may be coupled to the components of the system 100 in any suitable manner (e.g., via one or more transmission media, which may include wired and/or wireless transmission media) such that the processor 140 can receive output. The processor 140 may be configured to perform a number of functions using the output. A wafer inspection tool can receive instructions or other information from the processor 140. The processor 140 optionally may be in electronic communication with another wafer inspection tool, a wafer metrology tool, or a wafer review tool (not illustrated) to receive additional information or send instructions.

The processor 140 may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 140 may be disposed in or otherwise part of the system 100 or another device. In an example, the processor 140 and may be part of a standalone control unit or in a centralized quality control unit. Multiple processors 140 may be used, defining multiple subsystems of the system 100.

The processor 140 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 140 to implement various methods and functions may be stored in readable storage media, such as a memory.

If the system 100 includes more than one subsystem, then the different processors 140 may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 140 may be configured to perform a number of functions using the output of the system 100 or other output. For instance, the processor 140 may be configured to send the output to an electronic data storage unit or another storage medium. The processor 140 may be further configured as described herein.

The processor 140 may be configured according to any of the embodiments described herein. The processor 140 also may be configured to perform other functions or additional steps using the output of the system 100 or using images or data from other sources.

The processor 140 may be communicatively coupled to any of the various components or sub-systems of system 100 in any manner known in the art. Moreover, the processor 140 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 140 and other subsystems of the system 100 or systems external to system 100. Various steps, functions, and/or operations of system 100 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 140 (or computer subsystem) or, alternatively, multiple processors 140 (or multiple computer subsystems). Moreover, different sub-systems of the system 100 may include one or more computing or logic systems.

Therefore, the above description should not be interpreted as a limitation on the present disclosure but merely an illustration.

The processor 140 may be in electronic communication with the antenna 130. The processor 140 may be configured to read the photovoltaic radio frequency signal 122 received by the antenna 130. The processor 140 may be further configured to determine whether the LED 115 is a defective LED or a functioning LED based on the photovoltaic radio frequency signal 122.

Figure 4:
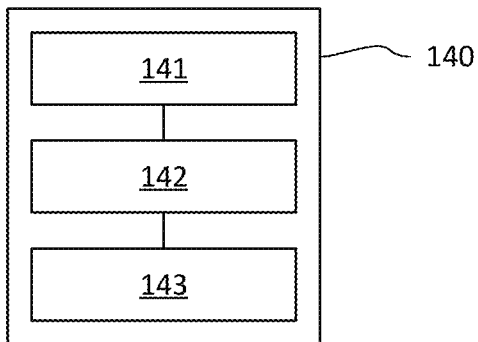
FIG. 4 is a schematic diagram of a processor according to an embodiment of the present disclosure.

In some embodiments, the processor 140 may comprise a receiving circuit 141, an amplifying circuit 142, and a determining circuit 143, as shown in FIG. 4. The receiving circuit 141 may be configured to receive the photovoltaic radio frequency signal 122 from the antenna 130. The amplifying circuit 142 may be configured to amplify the photovoltaic radio frequency signal 122 received by the receiving circuit 141, which may reduce noise in the signal and help differentiate the signals of defective LEDs and functioning LEDs. The determining circuit 143 may be configured to determine whether the LED 115 is a defective LED or a functioning LED based on the photovoltaic radio frequency signal 122 amplified by the amplifying circuit 142. The determining circuit 143 may be further configured to compare the photovoltaic radio frequency signal 122 to a model waveform. The LED 115 may be determined to be a defective LED or a functioning LED based on waveform fitting. For example, the waveform of the photovoltaic radio frequency signal 122 may be compared to a model waveform, and the LED 115 may be determined to be a defective LED or a functioning LED based on the waveform of the photovoltaic radio frequency signal 122 being similar to the model waveform. In an instance, for a pulsed laser beam 121 modelled as the function $\sin^2 x$, a model waveform of a photovoltaic radio frequency signal 122 of a functioning LED may be $10 \cdot (1 - e^{-0.1x}) + \sin^2 x \cdot (e^{-0.01x})$. The model waveform may be defined based on previous test data, e.g., by fitting a function to the received photovoltaic radio frequency signal 122 of a functioning LED. Other methods of analyzing the photovoltaic radio frequency signal 122 to determine whether the LED 115 is a defective LED or a functioning LED are possible (e.g., threshold comparison), and is not limited herein.

Figure 5A:
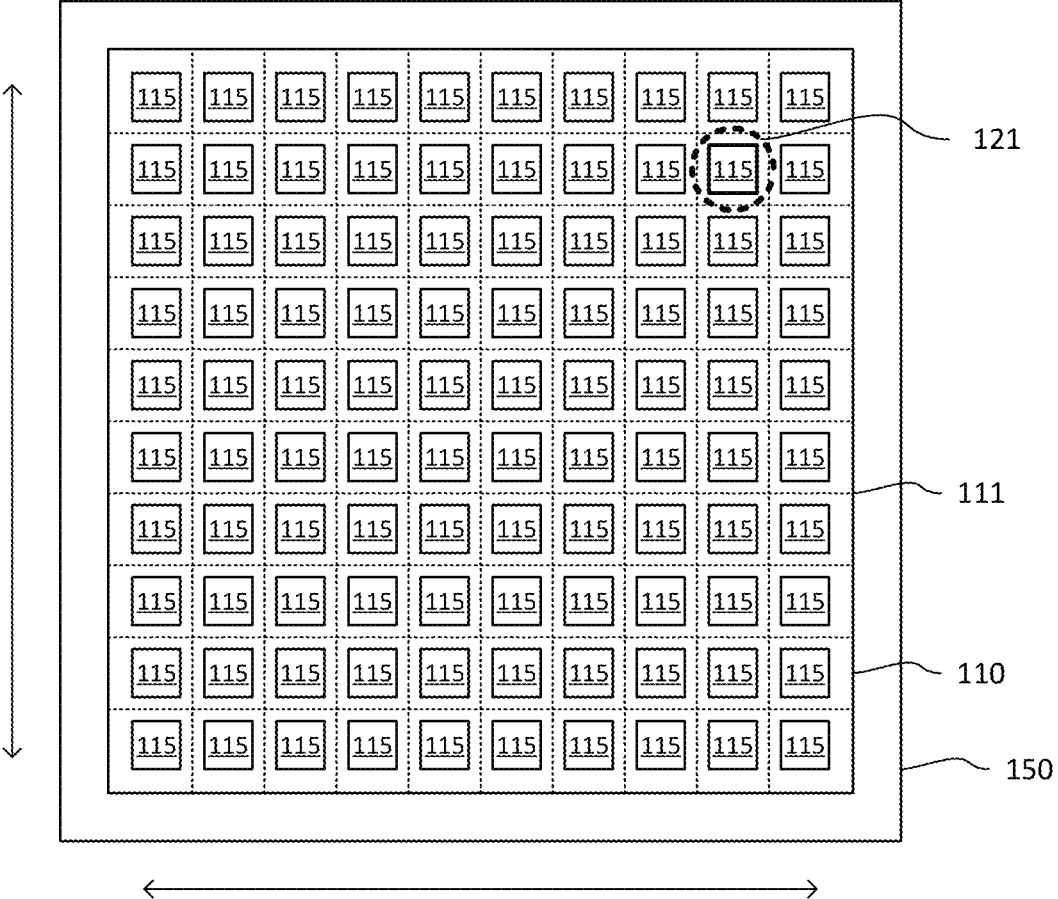
FIG. 5A is a top view of a substrate according to an embodiment of the present disclosure, where an LED is radiated by a pulsed laser beam.
Figure 5B:
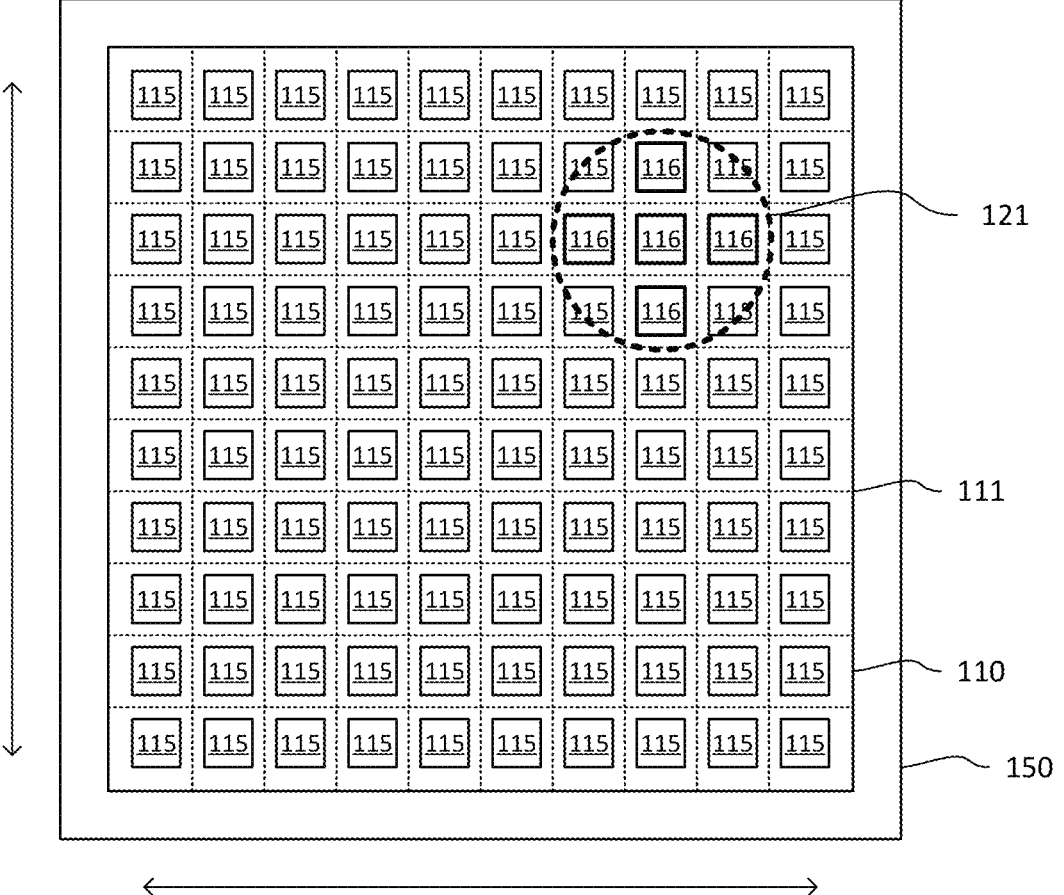
FIG. 5B is a top view of a substrate according to an embodiment of the present disclosure, where a first set of LEDs are radiated by a pulsed laser beam.
Figure 5C:
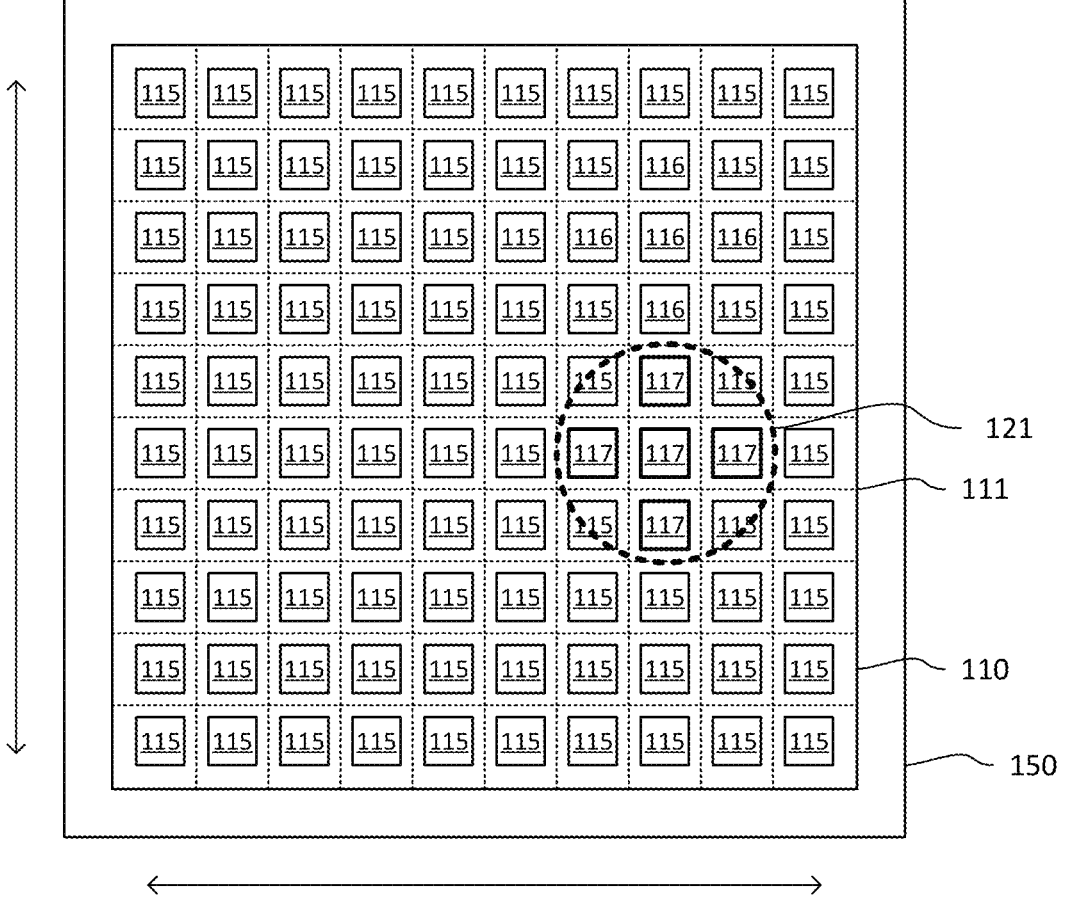
FIG. 5C is a top view of a substrate according to an embodiment of the present disclosure, where a second set of LEDs are radiated by a pulsed laser beam, after the stage is moved from the position shown in FIG. 5B.

The system 100 may further comprise a stage 150. The substrate 110 may be disposed on the stage 150. The stage 150 may be configured to move relative to the pulsed laser beam 121. For example, the stage 150 may be configured to move in a plane perpendicular to the pulsed laser beam 121, as shown in FIG. 5A. The stage 150 may be movable by one or more actuators or other means and is not limited herein. Alternatively, the laser generator 120 may be configured to move relative to the stage 150. When the stage 150 moves relative to the laser generator 120, the pulsed laser beam 121 may scan across the array of LEDs 115, so as to radiate each LED 115 with the pulsed laser beam 121. The pulsed laser beam 121 may radiate a single LED 115 or multiple LEDs 115. For example, the pulsed laser beam 121 may be configured to radiate a first set of LEDs 116 of the array of LEDs 115 (shown in FIG. 5B), based on the diameter of the pulsed laser beam 121, and by moving the stage 150, the pulsed laser beam 121 may be configured to radiate a second set of LEDs 117 of the array of LEDs 115 (shown in FIG. 5C). The LEDs 115 within the first set of LEDs 116 and the second set of LEDs 117 may be mutually exclusive or may overlap. By radiating the first set of LEDs 116, the second set of LEDs 117, and any number of additional sets of LEDs (or each single LED 115), all LEDs of the array of LEDs 115 may be radiated by the pulsed laser beam 121, and each LED generates a photovoltaic radio frequency signal 122. The stage 150 may move such that one or more pulses of the pulsed laser beam 121 radiate each LED 115. As each pulse may increase the intensity of the photovoltaic radio frequency signal 122 generated by each LED 115, the number of pulses may be optimized for sufficient signal reception and increased throughput. It should be understood that while a single LED 115 may be radiated by the pulsed laser beam 121, adjacent LEDs 115 may also be partially radiated by the pulsed laser beam 121. To avoid these partially-radiated LEDs 115 from affecting measurements, the stage 150 may move such that a non-continuous sequence of LEDs 115 on the substrate 110 are radiated by the pulsed laser beam 121.

The processor 140 may be in electronic communication with the actuators or other means configured to move the stage 150. In particular, the processor 140 may control the one or more actuators to move the stage 150 in a particular sequence in order to radiate each LED 115 on the substrate 110. The processor 140 may also track the position of the stage 150 and the position of each LED 115 under test. Accordingly, the processor 140 may map the position of each LED 115 to the decision whether the LED 115 is a defective LED or a functioning LED. This mapping may be used to identify the functioning LEDs that can be used, and the defective LEDs that can be discarded.

The system 100 may further comprise an oscilloscope 160. The oscilloscope 160 may be in electronic communication with the processor 140. The oscilloscope 160 may be configured to display the photovoltaic radio frequency signal 122 received by the antenna 130. The oscilloscope 160 may also display threshold lines and/or exemplary waveforms corresponding to defective and functioning LEDs. Accordingly, a user may read the photovoltaic radio frequency signal 122 on the oscilloscope 160 to determine whether the LED 115 is a defective LED or a functioning LED by comparing the measured value to the displayed threshold and/or exemplary waveforms.

With the system 100, the pulsed laser beam 121 may be used to inspect the LEDs 115 in a contactless manner, and the photovoltaic radio frequency signal 122 generated by the LEDs 115 may be received by the antenna 130 to determine whether each LED 115 is a defective LED or a functioning LED. The system 100 may therefore allow efficient testing of large amounts of micro LEDs manufactured on a substrate 110, so that defective LEDs are identified and not transferred to a display assembly.

Another embodiment of the present disclosure provides a method 200. With reference to FIG. 6, the method 200 may comprise the following steps.

At step 210, a pulsed laser beam is generated using a laser generator. The pulsed laser beam may have a frequency of 5 to 10 MHz. The wavelength of the pulsed laser beam may be selected based on the LED under test. For example, the wavelength of the pulsed laser beam may be less than or equal to the emission wavelength of the LED. In an instance, the pulsed laser beam may have a wavelength in the ultraviolet spectrum to inspect red, green, and blue LEDs. The pulsed laser beam may also be sized based on the LED under test. For example, the pulsed laser beam may have a diameter corresponding to a single LED. In some embodiments, the pulsed laser beam may have a diameter of 100 μm or smaller.

At step 220, the pulsed laser beam is directed toward an LED. The LED may be disposed on a substrate comprising an array of LEDs. The substrate may be comprised of GaAs, GaN, or other semiconductor wafer materials. The substrate may be rectangular, square, circular, or other shapes. In some instances, the substrate may have a width/diameter of 2-8 inches (e.g., 2, 3, 4, 6, or 8 inches, and any size therebetween). The LEDs may have various structure, such as lateral chip (shown in FIG. 2A), flip-chip (shown in FIG. 2B), vertical chip (shown in FIG. 2C), or other structures. The LEDs may be micro LEDs (e.g., less than 100 μm in in length and width and less than 8 μm in height) or other sizes. For example, each LED may be 10 μm by 10 μm. Based on the size of the substrate and the size of each LED, there may be over 1,000,000 LEDs disposed on the substrate. The pulsed laser beam may be directed toward the LED perpendicular to the substrate, or at one or more oblique angles relative to the substrate. The laser generator may be movable or rotatable to adjust the angle of incidence of the pulsed laser beam.

In some embodiments, the pulsed laser beam may be directed toward the array of LEDs to simultaneously radiate at least some of the array of LEDs. For example, based on the diameter of the pulsed laser beam, the pulsed laser beam may simultaneously radiate one or more LEDs of the array of LEDs.

In some embodiments, the pulsed laser beam may be scanned across the array of LEDs, such that each LED is radiated by the pulsed laser beam. For example, the substrate may be disposed on a stage that is movable in a plane perpendicular to the pulsed laser beam. By moving the stage relative to the laser generator, the pulsed laser beam may scan across the array of LEDs to radiate each LED.

At step 230, a photovoltaic radio frequency signal is generated based on interaction between the pulsed laser beam and the LED. When radiated by the pulsed laser beam, the LED may generate a photovoltaic radio frequency signal that is emitted in a direction away from the substrate. For example, the pulsed laser beam may cause a forward bias between the N-doped layer and the P-doped layer of the LED, which may emit near-field radio waves, forming the photovoltaic radio frequency signal. The photovoltaic radio frequency signal generated by the LED may vary, depending on whether the LED is a defective LED or a functioning LED.

At step 240, the photovoltaic radio frequency signal is received using an antenna. The sensitivity of the antenna may be small enough to distinguish the photovoltaic radio frequency signals emitted by defective LEDs and functioning LEDs. For example, the sensitivity of the antenna may be configured such that the signals of defective LEDs and functioning LEDs are 5 standard deviations apart. The antenna may be annular. For example, the antenna may define an aperture, which may be circular or other shapes. The laser generator may be configured to emit the pulsed laser beam toward the LED through the aperture of the antenna. The diameter of the aperture may be slightly larger than the diameter of the pulsed laser beam, so as to maximize the area of the bottom surface of the antenna, which receives the photovoltaic radio frequency signal. The size of the antenna may vary, depending on the size of the substrate, the distance between the antenna and the substrate, and geometric constraints within the system. In some embodiments, the antenna may be about ⅓ of the size of the substrate. When the antenna is positioned closer to the substrate, the size of the antenna may be smaller compared to the antenna being positioned farther from the substrate.

At step 250, the photovoltaic radio frequency signal is read with a processor in electronic communication with the antenna. For example, the antenna may be connected to the processor to send the photovoltaic radio frequency signal by wired and/or wireless transmission.

At step 260, the processor determines whether the LED is a defective LED or a functioning LED based on the photovoltaic radio frequency signal. For example, the processor may compare the photovoltaic radio frequency signal to a model waveform to determine whether the LED is a defective LED or a functioning LED. The LED may be determined to be a defective LED or a functioning LED based on waveform fitting. For example, the waveform of the photovoltaic radio frequency signal may be compared to the model waveform, and the LED may be determined to be a defective LED or a functioning LED based on the waveform of the photovoltaic radio frequency signal being similar to the model waveform. The model waveform may be defined based on previous test data, e.g., by fitting a function to the received photovoltaic radio frequency signal 122 of a functioning LED. Other methods of analyzing the photovoltaic radio frequency signal to determine whether the LED is a defective LED or a functioning LED are possible (e.g., threshold comparison), and is not limited herein.

The processor may be in electronic communication with the actuators or other means configured to move the stage. In particular, the processor may control the one or more actuators to move the stage in a particular sequence in order to radiate each LED on the substrate. The processor may also track the position of the stage and the position of each LED under test. Accordingly, the processor may map the position of each LED to the decision whether the LED is a defective LED or a functioning LED. This mapping may be used to identify the functioning LEDs that can be used, and the defective LEDs that can be discarded.

In some embodiments, before directing the pulsed laser beam toward the LED at step 210, the method 200 may further comprise step 205. At step 205, the substrate is diced to electrically separate each LED of the array of LEDs. During the fabrication process of the LEDs, each LED may be electrically connected together. By dicing the substrate, the electrical connections between each LED may be severed, in order to test each of the LEDs with the pulsed laser beam.

In some embodiments, the method 200 may further comprise the following steps.

At step 265, the substrate is singulated to physically separate each LED of the array of LEDs. By singulating the substrate, each LED can be physically separated from each other. For example, the functioning LEDs can be separated from the defective LEDs, as determined by the processor. The singulation process may comprise elastomer stamping, electrostatic transfer, electromagnetic transfer, laser-assisted, transfer, fluid self-assembly, or any other mass transfer process used to transfer each LED from the substrate to a target substrate.

At step 270, each functioning LED of the array of LEDs may be transferred to a display assembly. The functioning LEDs may be transferred manually or by a pick and place robot. The method of transfer may depend on the type of singulation process used, and is not limited herein. When there are a group of functioning LEDs in proximity to each other, the group of functioning LEDs may be transferred to the display assembly together. Each defective LED may not be transferred to the display assembly. For example, each defective LED may remain on the substrate or may be discarded.

With the method 200, the pulsed laser beam may be used to inspect the LEDs in a contactless manner, and the photovoltaic radio frequency signal generated by the LEDs may be received by the antenna to determine whether each LED is a defective LED or a functioning LED. The method 200 may therefore allow efficient testing of large amounts of micro LEDs manufactured on a substrate, so that defective LEDs are identified and not transferred to a display assembly.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:
a laser generator configured to emit a pulsed laser beam toward an LED, wherein the LED generates a photovoltaic radio frequency signal when radiated by the pulsed laser beam;
an antenna configured to receive the photovoltaic radio frequency signal generated by the LED; and
a processor in electronic communication with the antenna that is configured to:
read the photovoltaic radio frequency signal; and
determine whether the LED is a defective LED or a functioning LED based on the photovoltaic radio frequency signal.

2. The system of claim 1, wherein the pulsed laser beam has a frequency of 5 to 10 MHz.

3. The system of claim 1, wherein the LED comprises an array of LEDs disposed on a substrate.

4. The system of claim 3, wherein the laser generator is configured to radiate a single LED of the array of LEDs.

5. The system of claim 3, further comprising:
a stage configured to move in a plane perpendicular to the pulsed laser beam, wherein the substrate is disposed on the stage;
wherein the laser generator is further configured to scan the pulsed laser beam across the array of LEDs by moving the stage relative to the laser generator, such that each LED generates a photovoltaic radio frequency signal when radiated by the pulsed laser beam.

6. The system of claim 1, wherein the LED has a lateral chip structure.

7. The system of claim 1, wherein the antenna is annular and defines an aperture, and the laser generator is configured to emit the pulsed laser beam toward the LED through the aperture of the antenna.

8. The system of claim 1, wherein the processor comprises:
a receiving circuit configured to receive the photovoltaic radio frequency signal from the antenna;
an amplifying circuit configured to amplify the photovoltaic radio frequency signal received by the receiving circuit; and
a determining circuit configured to determine whether the LED is a defective LED or a functioning LED based on the photovoltaic radio frequency signal amplified by the amplifying circuit.

9. The system of claim 1, wherein the processor is configured to determine whether the LED is a defective LED or a functioning LED by:
comparing the photovoltaic radio frequency signal to a model waveform;

wherein the LED is determined to be a defective LED or a functioning LED based on a similarity of the photovoltaic radio frequency signal and the model waveform.

10. The system of claim 1, further comprising:
an oscilloscope in electronic communication with the processor and configured to display the photovoltaic radio frequency signal.

11. A method comprising:
generating a pulsed laser beam using a laser generator;
directing the pulsed laser beam toward an LED;
generating a photovoltaic radio frequency signal based on interaction between the pulsed laser beam and the LED;
receiving the photovoltaic radio frequency signal using an antenna;
reading the photovoltaic radio frequency signal with a processor in electronic communication with the antenna; and
determining, using the processor, whether the LED is a defective LED or a functioning LED based on the photovoltaic radio frequency signal.

12. The method of claim 11, wherein the pulsed laser beam has a frequency of 5 to 10 MHz.

13. The method of claim 11, wherein the LED comprises an array of LEDs disposed on a substrate.

14. The method of claim 13, wherein directing the pulsed laser beam toward the LED comprises:
directing the pulsed laser beam toward the array of LEDs to radiate a single LED of the array of LEDs.

15. The method of claim 13, wherein directing the pulsed laser beam toward the LED comprises:
scanning the pulsed laser beam across the array of LEDs, such that each LED generates a photovoltaic radio frequency signal when radiated by the pulsed laser beam.

16. The method of claim 15, wherein the substrate is disposed on a stage that is movable in a plane perpendicular to the pulsed laser beam, and scanning the pulsed laser beam across the array of LEDs comprises:
scanning the pulsed laser beam across the array of LEDs by moving the stage relative to the laser generator.

17. The method of claim 13, wherein, before directing the pulsed laser beam toward the LED, the method further comprises:
dicing the substrate to electrically separate each LED of the array of LEDs.

18. The method of claim 13, further comprising:
singulating the substrate to physically separate each LED of the array of LEDs; and
transferring each functioning LED of the array of LEDs to a display assembly.

19. The method of claim 11, wherein the antenna is annular and defines an aperture, and directing the pulsed laser beam toward the LED comprises:
directing the pulsed laser beam toward the LED through the aperture of the antenna.

20. The method of claim 11, wherein determining, using the processor, whether the LED is a defective LED or a functioning LED comprises:
comparing, using the processor, the photovoltaic radio frequency signal to a model waveform;
wherein the LED is determined to be a defective LED or a functioning LED based on a similarity of the photovoltaic radio frequency signal and the model waveform.

* * * * *